United States Patent
Lin et al.

(10) Patent No.: US 10,930,202 B2
(45) Date of Patent: Feb. 23, 2021

(54) DISPLAY APPARATUS

(71) Applicant: PlayNitride Display Co., Ltd., MiaoLi County (TW)

(72) Inventors: Tzu-Yang Lin, MiaoLi County (TW); Mi-Hung Lai, MiaoLi County (TW); Pei-Hsin Chen, MiaoLi County (TW); Yi-Chun Shih, MiaoLi County (TW); Yi-Ching Chen, MiaoLi County (TW); Yu-Chu Li, MiaoLi County (TW); Ying-Tsang Liu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 16/430,454

(22) Filed: Jun. 4, 2019

(65) Prior Publication Data

US 2019/0378452 A1    Dec. 12, 2019

(30) Foreign Application Priority Data

Jun. 8, 2018 (TW) .............................. 107119847 A (51) Int. Cl.
G09G 3/32 (2016.01)
G09G 3/20 (2006.01)

(52) U.S. Cl.
CPC ............. *G09G 3/32* (2013.01); *G09G 3/2003* (2013.01); *G09G 2310/0264* (2013.01)

(58) Field of Classification Search
CPC .................. G09G 3/32; G09G 3/2003; G09G 2310/0264; G09G 2300/0452; H01L 31/00

See application file for complete search history.

(56) References Cited

U.S. PATENT DOCUMENTS

| | | | |
|---|---|---|---|
| 10,312,414 B1* | 6/2019 | Chen | H01L 33/382 |
| 2016/0315218 A1* | 10/2016 | Bour | H01L 33/06 |
| 2016/0372514 A1* | 12/2016 | Chang | G09G 3/2003 |
| 2017/0229430 A1* | 8/2017 | Lai | H01L 25/0753 |
| 2017/0373122 A1 | 12/2017 | Chen | |
| 2018/0090058 A1 | 3/2018 | Chen et al. | |
| 2018/0122836 A1* | 5/2018 | Kang | H01L 33/08 |
| 2018/0190747 A1* | 7/2018 | Son | H01L 27/3267 |
| 2018/0240937 A1* | 8/2018 | Park | H05B 33/14 |
| 2019/0140016 A1* | 5/2019 | Hwang | H01L 33/32 |
| 2019/0198716 A1* | 6/2019 | Gordon | H01L 33/46 |
| 2019/0214537 A1* | 7/2019 | Ahn | H01L 27/1214 |
| 2019/0219812 A1* | 7/2019 | Havens | G02B 23/16 |

FOREIGN PATENT DOCUMENTS

| | | |
|---|---|---|
| CN | 108022524 | 5/2018 |
| TW | 201701458 | 1/2017 |
| TW | I621249 | 4/2018 |

OTHER PUBLICATIONS

"Office Action of Taiwan Counterpart Application", dated May 16, 2019, pp. 1-6.

* cited by examiner

Primary Examiner — Ibrahim A Khan
(74) Attorney, Agent, or Firm — JCIPRNET (57) ABSTRACT

A display apparatus includes a driving substrate and a plurality of micro light-emitting devices (LEDs). The driving substrate has a plurality of pixel regions. The plurality micro LEDs are disposed in in each of the pixel regions and electrically connected to the driving substrate. Orthogonal projection areas of the micro LEDs in each of the pixel regions on the driving substrate are equal. At least two micro LEDs in each of the pixel regions have different effective light-emitting areas.

12 Claims, 8 Drawing Sheets

DISPLAY APPARATUS

CROSS-REFERENCE TO RELATED APPLICATION

This application claims the priority benefit of Taiwan application serial no. 107119847, filed on Jun. 8, 2018. The entirety of the above-mentioned patent application is hereby incorporated by reference herein and made a part of this specification.

BACKGROUND

Technical Field

The disclosure relates to a display apparatus and more particularly relates to a display apparatus using micro light-emitting devices (micro LEDs) as display pixels.

Description of Related Art

With the advancement of optoelectronic technology, the sizes of an optoelectronic elements are miniatured. In recent years, because of the breakthrough in miniaturization of a light-emitting diodes (LEDs), a micro-LED displays manufactured by arranging microlight-emitting diodes into array are increasingly attracting the consumer market. However, an electrical performance and a light emission wavelength of the micro LEDs are relatively unstable in small current density, and therefore the micro LEDs have a leakage issue. In addition, in order to balance the effect of color perception on human eyes and improving the display quality, the LEDs of different colored lights in each pixel region have different sizes. Therefore, it is challenging to transfer LEDs having different sizes from the carrier substrate to the receiving substrate and the manufacturing cost increases.

SUMMARY

The disclosure provides a display apparatus that has efficient electrical reliability and reduce the production costs.

The display apparatus according to the disclosure includes a driving substrate and a plurality of micro light-emitting devices (LEDs). The driving substrate has a plurality of pixel regions. The plurality micro LEDs are disposed in each of the pixel regions of the driving substrate and are electrically connected to the driving substrate. Orthogonal projection areas of the micro LEDs in each of the pixel regions on the driving substrate are equal. At least two micro LEDs in each of the pixel regions have different effective light-emitting areas.

In an embodiment of the disclosure, at least two of the micro LEDs in each of the pixel regions include a first micro LED that emits red light and a second micro LED that emits blue light. An effective light-emitting area of the first micro LED is greater than an effective light-emitting area of the second micro LED.

In an embodiment of the disclosure, in each of the pixel regions, an orthogonal projection length of the first micro LED on the driving substrate is equal to an orthogonal projection length of the second micro LED on the driving substrate.

In an embodiment of the disclosure, each of the micro LEDs includes a first type semiconductor layer, an active layer, a second type semiconductor layer, and a through hole. The through hole sequentially penetrates the second type semiconductor layer, the active layer, and a portion of the first type semiconductor layer. A hole diameter of the through hole of the first micro LED is smaller than a hole diameter of the through hole of the second micro LED in each of the pixel regions.

In an embodiment of the disclosure, an area of the active layer of the first micro LED is greater than an area of the active layer of the second micro LED.

In an embodiment of the disclosure, each of the micro LEDs includes a first type semiconductor layer, an active layer, and a second type semiconductor layer. The active layer has a low resistance region and a high resistance region surrounding the low resistance region. In each of the pixel regions, an area of the high resistance region of the active layer of the first micro LED is smaller than an area of the high resistance region of the active layer of the second micro LED.

In an embodiment of the disclosure, each of the micro LEDs includes a first type semiconductor layer, an active layer, and a second type semiconductor layer. In each of the pixel regions, an edge of the first type semiconductor layer, a side wall of the active layer, and a side wall of the second type semiconductor layer of the first micro LED are cut flush with a surface, and a length of the active layer of second micro LED is larger than a length of the active layer of the first micro LED.

In an embodiment of the disclosure, each of the micro LEDs includes a first type semiconductor layer, an active layer, a second type semiconductor layer, and a current distributing layer. In each of the pixel regions, a side wall of the first type semiconductor layer, a side wall of the active layer, and a side wall of the second type semiconductor layer are cut flush with a surface. A contact area between the current distributing layer and the second type semiconductor layer of the second micro LED is smaller than a contact area between the current distributing layer and the second type semiconductor layer of the first micro LED.

In an embodiment of the disclosure, each of the micro LEDs includes a first type semiconductor layer, an active layer, and a second type semiconductor layer. In each of the pixel regions, a side wall of the first type semiconductor layer, a side wall of the active layer, and a side wall of the second type semiconductor layer of the first micro LED are cut flush with a surface. The active layer of the second micro LED exposes a portion of the first type semiconductor layer.

In an embodiment of the disclosure, a ratio of the effective light-emitting area of the first micro LED to the effective light-emitting area of the second micro LED is 1.5 to 5.

In an embodiment of the disclosure, each of the pixel regions includes a first micro LED that emits red light, a second micro LED that emits blue light, and a third micro LED that emits green light. An effective light-emitting area of the first micro LED is greater than an effective light-emitting area of the second micro LED and the effective light-emitting area of the second micro LED is greater than an effective light-emitting area of the third micro LED.

In an embodiment of the disclosure, each of the pixel regions includes a first micro LED that emits red light, a second micro LED that emits blue light, and a third micro LED that emits green light. An effective light-emitting area of the first micro LED is greater than an effective light-emitting area of the second micro LED or the third micro LED.

Based on the above, in the display apparatus of the disclosure, the micro LEDs in each of the pixel regions have equal orthogonal projection areas on the driving substrate. Moreover, at least two micro LEDs in each of the pixel regions have different effective light-emitting areas. In other words, the micro LEDs in each of the pixel regions have the same size and at least two micro LEDs have different effective light-emitting areas. This design balances the effect of color perception on human eyes and improves the display quality and reduced the production costs.

To make the aforementioned more comprehensible, several embodiments accompanied with drawings are described in detail as follows.

BRIEF DESCRIPTION OF THE DRAWINGS

The accompanying drawings are included to provide a further understanding of the disclosure and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

Figure 1A:
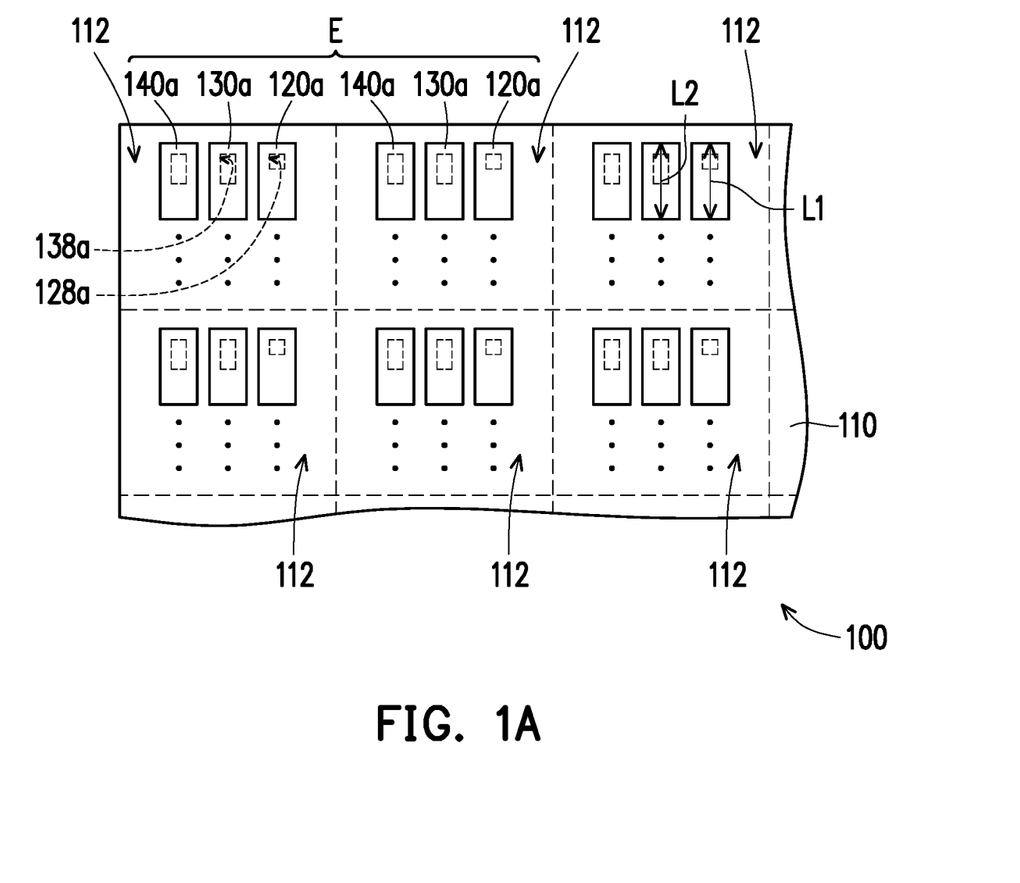
FIG. 1A is a schematic top view of a display apparatus according to an embodiment of the disclosure.
Figure 1B:
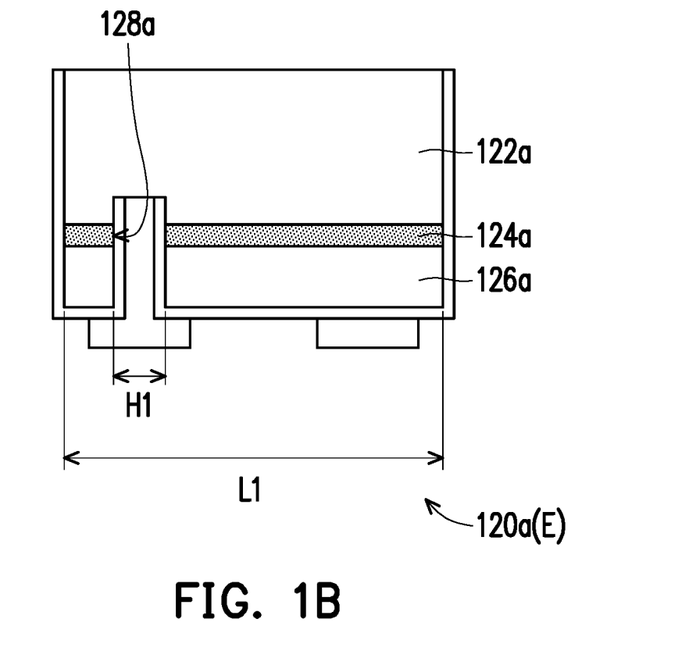
FIG. 1B and FIG. 1C are schematic cross-sectional views respectively showing the first micro LED and the second micro LED in FIG. 1A.
Figure 1C:
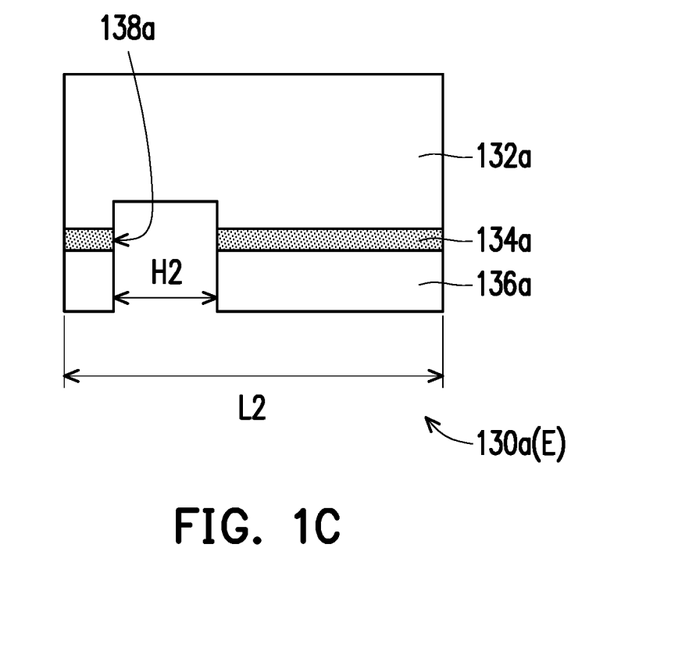

FIG. 1A is a schematic top view of a display apparatus according to an embodiment of the disclosure. FIG. 1B and FIG. 1C are schematic cross-sectional views respectively showing a first micro LED and a second micro LED in FIG. 1A. Referring to FIG. 1A, FIG. 1B, and FIG. 1C, in this embodiment, the display apparatus 100 includes a driving substrate 110 and a plurality of micro LEDs E. The driving substrate 110 has a plurality of pixel regions 112 and each pixel region 112 is provided with three micro LEDs E. The micro LEDs E are disposed in the pixel regions 112 of the driving substrate 110 and are electrically connected to the driving substrate 110. In particular, the orthogonal projection areas of the micro LEDs E in each of the pixel regions 112 on the driving substrate 110 are equal and at least two micro LEDs E in each of the pixel regions 112 have different effective light-emitting areas.

In aforementioned, the display apparatus 100 is, for example, a micro LED display. Generally, the micro LED display further includes other components such as a central control processor, a touch device, a battery, etc. The micro LED display is, for example, a television, a watch, a phone, a laptop computer, a computer monitor, a digital camera, a handheld game device, a multimedia display, a car display, or a large-area electronic signboard. Nevertheless, the disclosure is not limited thereto. The "micro" LED E described here refers to a light-emitting device that has a length of 1 μm to 100 μm. In some embodiments, the micro LED E may have a maximum length of 30 μm or 15 μm. In some embodiments, the micro LED E may have a height less than 10 μm or even 5 μm. However, it should be understood that the embodiments of the disclosure are not necessarily limited thereto, and in certain embodiments, larger and smaller sizes may be used. The driving substrate 110 is, for example, a complementary metal oxide semiconductor (CMOS) substrate, a liquid crystal on silicon (LCOS) substrate, a thin film transistor (TFT) substrate, or other substrates with a function circuit. Nevertheless, the disclosure is not limited thereto.

Specifically, the three micro LEDs E in each of the pixel regions 112 include a first micro LED 120a, a second micro LED 130a, and a third micro LED 140a of different colored lights, wherein the effective light-emitting area of the first micro LED 120a is different from the effective light-emitting area of the second micro LED 130a. For example, the effective light-emitting area of the first micro LED 120a is greater than the effective light-emitting area of the second micro LED 130a. The effective light-emitting area of the first micro LED 120a is greater than the effective light-emitting area of the third micro LED 140a. In each of the pixel regions 112, an orthogonal projection length L1 of the first micro LED 120a on the driving substrate 110 is substantially equal to an orthogonal projection length L2 of the second micro LED 130a on the driving substrate 110. Moreover, the orthogonal projection width of the first micro LED 120a and the orthogonal projection width of the second micro LED 130a are substantially equal. In other words, the first micro LED 120a and the second micro LED 130a have the same size. The orthogonal projection length described here is shown by the schematic cross-sectional structure but is not limited to the cross-section and direction shown in the figure.

As shown in FIG. 1B and FIG. 1C, in each of the pixel regions 112, the first micro LED 120a includes a first type semiconductor layer 122a, an active layer 124a, a second type semiconductor layer 126a, and a through hole 128a, wherein the through hole 128a penetrates the second type semiconductor layer 126a, the active layer 124a, and a portion of the first type semiconductor layer 122a. The second micro LED 130a includes a first type semiconductor layer 132a, an active layer 134a, a second type semiconductor layer 136a, and a through hole 138a, wherein the through hole 138a penetrates the second type semiconductor layer 136a, the active layer 134a, and a portion of the first type semiconductor layer 132a. In particular, a hole diameter H1 of the through hole 128a of the first micro LED 120a is smaller than a hole diameter H2 of the through hole 138a of the second micro LED 130a, so that the length or area of the active layer 124a of the first micro LED 120a is greater than the length or area of the active layer 134a of the second micro LED 130a. Therefore, the effective light-emitting area of the first micro LED 120a is greater than the effective light-emitting area of the second micro LED 130a in each of the pixel regions 112. It should be noted that the effective light-emitting areas described here depend on the areas of the active layers 124a and 134a that are involved in light emission. For example, the ratio of the effective light-emitting area of the first micro LED 120a to the effective light-emitting area of the second micro LED 130a is 1.5 to 5.

In aforementioned, the first micro LEDs 120a and the second micro LEDs 130a may be vertical type micro LEDs or flip-chip type micro LEDs, for example, and the maximum width thereof may be 1 µm to 100 µm, and preferably 3 µm to 50 µm. The thickness of the first type semiconductor layers 122a and 132a on the vertical cross-section may be 1 µm to 5 µm, the thickness of the active layers 124a and 134a on the vertical cross-section may be 0.1 µm to 1 µm, and the thickness of the second type semiconductor layers 126a and 136a on the vertical cross-section may be 0.1 µm to 1 µm, so as to keep the overall thickness of the first micro LED 120a and the second micro LED 130a in the range of 1 µm to 7 µm to ensure the yield of the subsequent processes and characteristics of the end product.

Further, referring to FIG. 1A again, specifically, the micro LEDs E of this embodiment include a plurality of first micro LEDs 120a, a plurality of second micro LEDs 130a, and a plurality of third micro LEDs 140a, wherein the first micro LEDs 120a, the second micro LEDs 130a, and the third micro LEDs 140a emit different colored lights, thereby providing the display apparatus 100 that displays a full-color image. The first micro LED 120a, the second micro LED 130a, and the third micro LED 140a have equal orthogonal projection areas on the driving substrate 110, which means that the first micro LED 120a, the second micro LED 130a, and the third micro LED 140a have the same size. For example, the first micro LED 120a is a red micro LED, the second micro LED 130a is a blue micro LED, and the third micro LED 140a is a green micro LED. In this embodiment, as shown in FIG. 1A, three micro LEDs E, that is, one first micro LED 120a, one second micro LED 130a, and one third micro LED 140a, are disposed in each pixel region 112 as an example and the disclosure is not limited thereto. Those having ordinary skill in the art may change the number of the micro LEDs E according to actual needs with reference to the disclosure. In addition, the third micro LED 140a and the second micro LED 130a have identical structural features and therefore details thereof will not be repeated hereinafter.

In brief, in the display apparatus 100 of this embodiment, the micro LEDs E in each of the pixel regions 112 have equal orthogonal projection areas on the driving substrate 110. Since the hole diameter H1 of the through hole 128a of the first micro LED 120a is smaller than the hole diameter H2 of the through hole 138a of the second micro LED 130a, the area of the active layer 124a of the first micro LED 120a is greater than the area of the active layer 134a of the second micro LED 130a. As a result, the effective light-emitting area of the first micro LED 120a is greater than the effective light-emitting area of the second micro LED 130a. In other words, the micro LEDs E in each of the pixel regions 112 have the same size, but at least two micro LEDs E with different light colors have different effective light-emitting areas. This design balances the influence of human eyes on color perception and improves the display quality, and allows the display apparatus 100 of this embodiment to achieve favorable electrical reliability and manufacturing yield and lower the production costs.

It should be mentioned that the reference numerals and some descriptions in the previous embodiment are also applied to the following embodiment. The same reference numerals are presented to denote identical or similar components in the embodiments and repetitive descriptions are omitted. The omitted descriptions may be found in the previous embodiment and thus will not be repeated hereinafter.

Figure 2A:
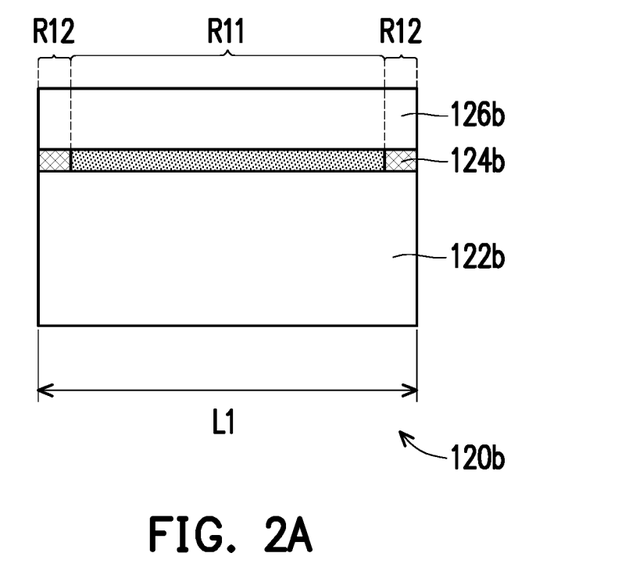
FIG. 2A and FIG. 2B are schematic cross-sectional views respectively showing the first micro LED and the second micro LED of a display apparatus according to another embodiment of the disclosure.
Figure 2B:
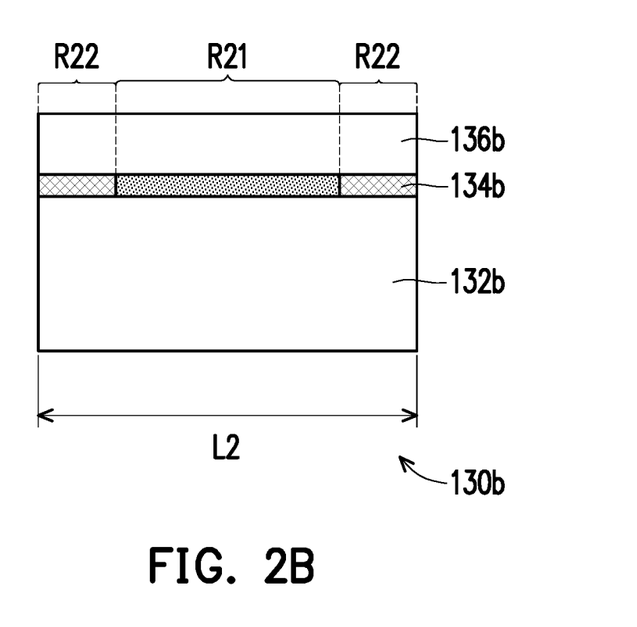

FIG. 2A and FIG. 2B are schematic cross-sectional views respectively showing the first micro LED and the second micro LED of a display apparatus according to another embodiment of the disclosure. Referring to FIG. 1B, FIG. 1C, FIG. 2A, and FIG. 2B, the first micro LED 120b and the second micro LED 130b of this embodiment are similar to the first micro LED 120a and the second micro LED 130a in FIG. 1B and FIG. 1C respectively, and a difference between them is that: in this embodiment, in each of the pixel regions 112 (referring to FIG. 1A), the first micro LED 120b includes a first type semiconductor layer 122b, an active layer 124b, and a second type semiconductor layer 126b sequentially, wherein the active layer 124b has a low resistance region R11 and a high resistance region R12 surrounding the low resistance region R11. The second micro LED 130b includes a first type semiconductor layer 132b, an active layer 134b, and a second type semiconductor layer 136b sequentially, wherein the active layer 134b has a low resistance region R21 and a high resistance region R22 surrounding the low resistance region R21. In particular, the high resistance region R12 of the active layer 124b of the first micro LED 120b is smaller than the high resistance region R22 of the active layer 134b of the second micro LED 130b. Therefore, when driven by a current, the design that the effective light-emitting area of the first micro LED 120b is greater than the effective light-emitting area of the second micro LED 130b balances the influence of human eyes on color perception and improves the display quality. Similar to the embodiment of FIG. 1B and FIG. 1C, the first micro LED 120b and the second micro LED 130b have equal orthogonal projection areas on the driving substrate 110. That is, the first micro LED 120b and the second micro LED 130b have substantially the same area/size. Here, the high resistance regions R12 and R22 are, for example, formed by destroying the lattice or doping impurity with high energy. Nevertheless, the disclosure is not limited thereto.

Figures 3A, 3B:
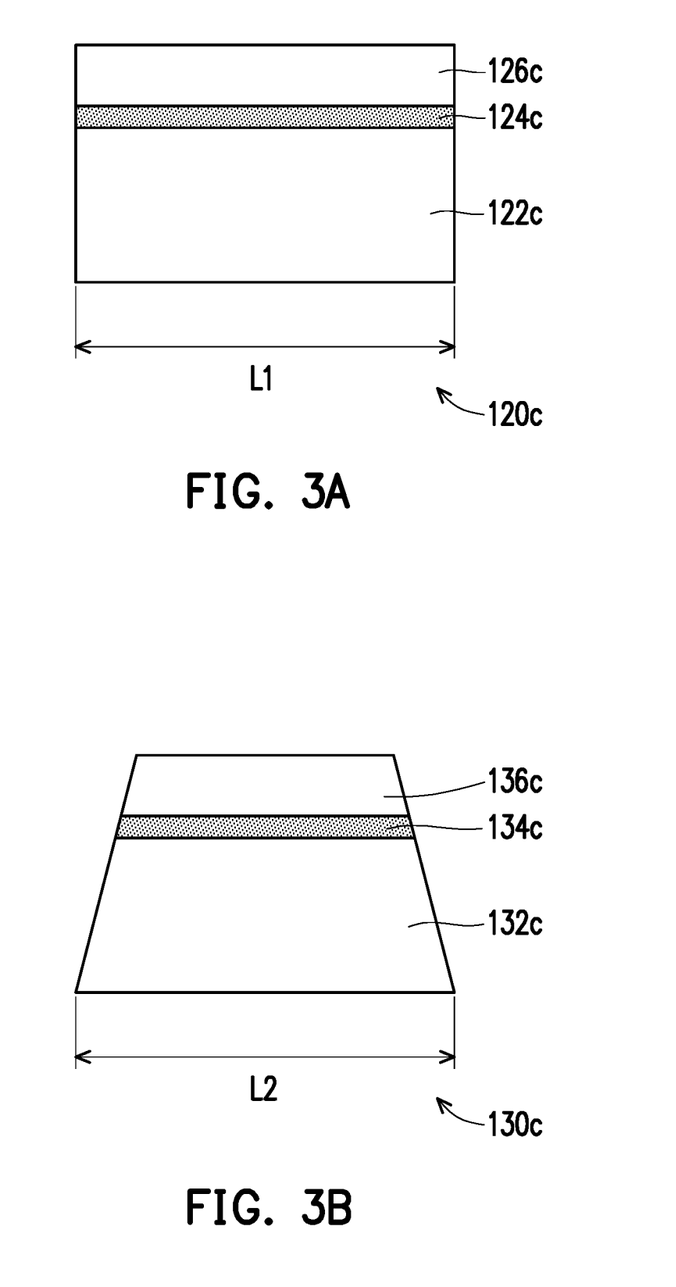
FIG. 3A and FIG. 3B are schematic cross-sectional views respectively showing the first micro LED and the second micro LED of a display apparatus according to another embodiment of the disclosure.

FIG. 3A and FIG. 3B are schematic cross-sectional views respectively showing the first micro LED and the second micro LED of a display apparatus according to another embodiment of the disclosure. Referring to FIG. 1B, FIG. 1C, FIG. 3A, and FIG. 3B, the first micro LED 120c and the second micro LED 130c of this embodiment are similar to the first micro LED 120a and the second micro LED 130a in FIG. 1B and FIG. 1C respectively, and a difference between them is that: in each of the pixel regions 112 (referring to FIG. 1A), the first micro LED 120c includes a first type semiconductor layer 122c, an active layer 124c, and a second type semiconductor layer 126c sequentially, and the second micro LED 130c includes a first type semiconductor layer 132c, an active layer 134c, and a second type semiconductor layer 136c sequentially. In particular, a side wall of the first type semiconductor layer 122c of the first micro LED 120c, a side wall of the active layer 124c, and a side wall of the second type semiconductor layer 126c are cut flush with a surface. The length of the second micro LED 130c gradually decreases from the first type semiconductor layer 132c toward the second type semiconductor layer 136c. In other words, the cross-sectional shape of the first micro LED 120c in the vertical direction is a rectangle and the cross-sectional shape of the second micro LED 130c in the vertical direction is a trapezoid. The structural design of the first micro LED 120c and the second micro LED 130c allows the length (and the area) of the active layer 124c of the first micro LED 120c to be greater than the length (and the area) of the active layer 134c of the second micro LED 130c. As a result, in the case where the orthogonal projection length L1 of the first micro LED 120c on the driving substrate 110 (referring to FIG. 1A) is substantially equal to the orthogonal projection length L2 of the second micro LED 130c on the driving substrate 110, that is, the first micro LED 120c and the second micro LED 130c have the same size, the effective light-emitting area of the first micro LED 120c is still greater than the effective light-emitting area of the second micro LED 130c, so as to balance the influence of human eyes on color perception and improve the display quality.

Figure 3C:
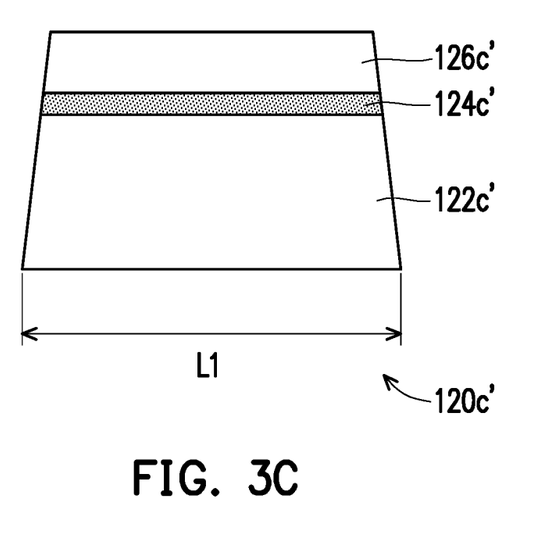
FIG. 3C and FIG. 3D are schematic cross-sectional views respectively showing the first micro LED and the second micro LED of a display apparatus according to another embodiment of the disclosure.
Figure 3D:
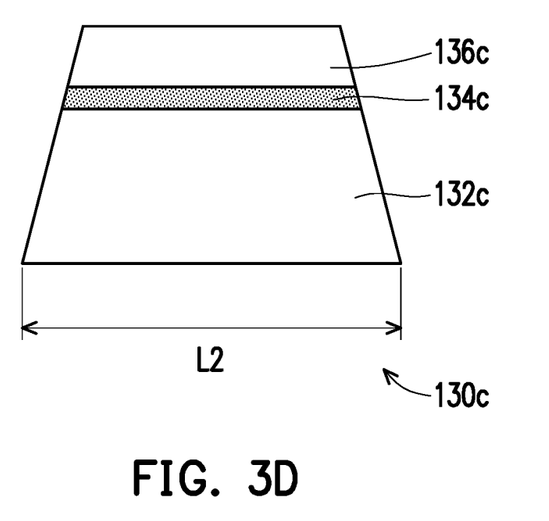

FIG. 3C and FIG. 3D are schematic cross-sectional views respectively showing the first micro LED and the second micro LED of a display apparatus according to another embodiment of the disclosure. Referring to FIG. 3A, FIG. 3B, FIG. 3C, and FIG. 3D, the first micro LED 120c' and the second micro LED 130c of this embodiment are similar to the first micro LED 120c and the second micro LED 130c in FIG. 3A and FIG. 3B respectively, and a difference between them is that: in this embodiment, the cross-sectional shape of the first micro LED 120c' in the vertical direction is a trapezoid. That is, the length of the first micro LED 120c' gradually decreases from the first type semiconductor layer 122c' toward the active layer 124c' and the second type semiconductor layer 126c'. Here, a gradually reducing ratio of the length of the trapezoidal cross-section of the first micro LED 120c' is different from a gradually reducing ration of the length of the trapezoidal cross-section of the second micro LED 130c. In the case where the orthogonal projection length L1 on the first micro LED 120c' on the driving substrate 110 (referring to FIG. 1A) is substantially equal to the orthogonal projection length L2 of the second micro LED 130c on the driving substrate 110, that is, the first micro LED 120c' and the second micro LED 130 have the same size, the effective light-emitting area of the first micro LED 120c' is still greater than the effective light-emitting area of the second micro LED 130c.

Figure 4A:
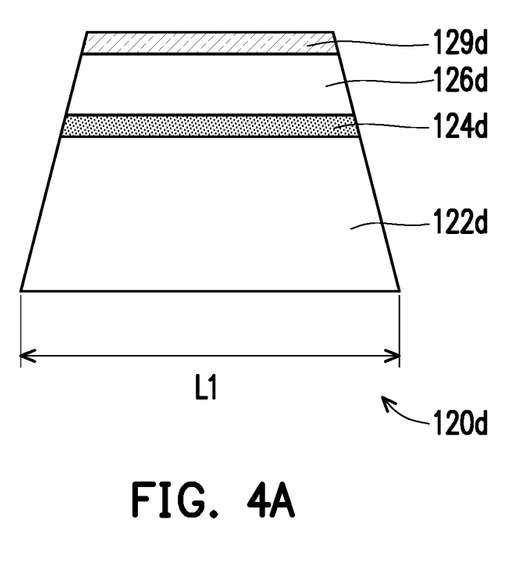
FIG. 4A and FIG. 4B are schematic cross-sectional views respectively showing the first micro LED and the second micro LED of a display apparatus according to another embodiment of the disclosure.
Figure 4B:
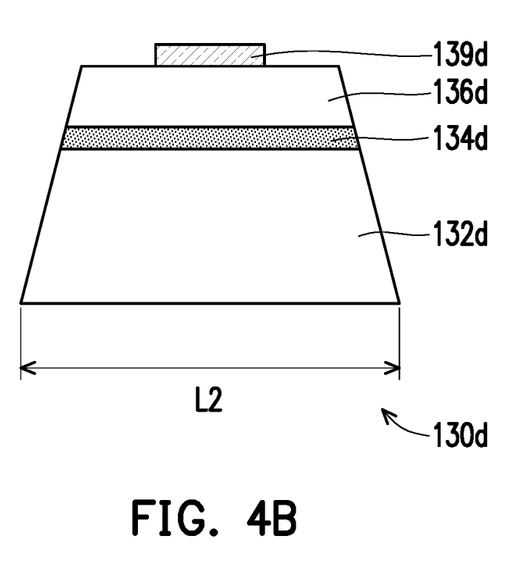

FIG. 4A and FIG. 4B are schematic cross-sectional views respectively showing the first micro LED and the second micro LED of a display apparatus according to another embodiment of the disclosure. Referring to FIG. 3B, the first micro LED 120d and the second micro LED 130d of this embodiment are similar to the second micro LED 130c in FIG. 3B, and a difference between them is that: in each of the pixel regions 112 (referring to FIG. 1A), the first micro LED 120d includes a first type semiconductor layer 122d, an active layer 124d, a second type semiconductor layer 126d, and a current distributing layer 129d sequentially, wherein from the edge of the first type semiconductor layer 122d toward the edge of the active layer 124d and the edge of the second type semiconductor layer 126d, the length of the first micro LED 120d gradually decreases. The second micro LED 130d includes a first type semiconductor layer 132d, an active layer 134d, a second type semiconductor layer 136d, and a current distributing layer 139d sequentially, wherein from the edge of the first type semiconductor layer 132d toward the edge of the active layer 134d and the edge of the second type semiconductor layer 136d, the length of the second micro LED 130d gradually decreases. In other words, the cross-sectional shapes of the first micro LED 120d and the second micro LED 130d in the vertical direction are similar trapezoids. However, the contact area between the current distributing layer 139d and the second type semiconductor layer 136d of the second micro LED 130d is smaller than the contact area between the current distributing layer 129d and the second type semiconductor layer 126d of the first micro LED 120d. The first micro LED 120d and the second micro LED 130d may control the position and area of the current collection region through the current distributing layers 129d and 139d respectively, so as to improve the light-emitting efficiency and overall display quality of the first micro LED 120d and the second micro LED 130d.

In particular, in this embodiment, an edge of the current distributing layer 129d of the first micro LED 120d is cut flush with a side wall of the second type semiconductor layer 126d, and the current distributing layer 139d of the second micro LED 130d exposes a portion of the second type semiconductor layer 136d. The structural design of the first micro LED 120d and the second micro LED 130d allows the length of the current distributing layer 129d of the first micro LED 120d to be greater than the length of the current distributing layer 139d of the second micro LED 130d. As a result, when driven by a current, the effective light-emitting area of the first micro LED 120d is greater than the effective light-emitting area of the second micro LED 130d, so as to balance the influence of human eyes on color perception and improve the display quality.

Figure 5A:
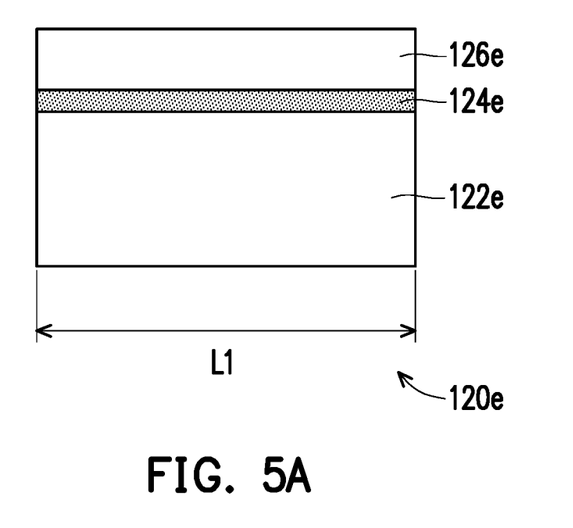
FIG. 5A and FIG. 5B are schematic cross-sectional views respectively showing the first micro LED and the second micro LED of a display apparatus according to another embodiment of the disclosure.
Figure 5B:
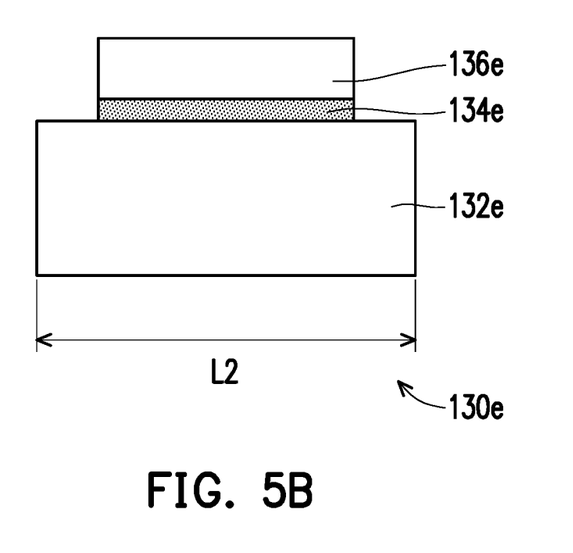

FIG. 5A and FIG. 5B are schematic cross-sectional views respectively showing the first micro LED and the second micro LED of a display apparatus according to another embodiment of the disclosure. Referring to FIG. 1B, FIG. 1C, FIG. 3A, and FIG. 3B, the first micro LED 120e and the second micro LED 130e of this embodiment are similar to the first micro LED 120a and the second micro LED 130a in FIG. 1B and FIG. 1C respectively, and a difference between them is that: in each of the pixel regions 112 (referring to FIG. 1A), the first micro LED 120e includes a first type semiconductor layer 122e, an active layer 124e, and a second type semiconductor layer 126e sequentially, and the second micro LED 130e includes a first type semiconductor layer 132e, an active layer 134e, and a second type semiconductor layer 136e sequentially. In particular, a side wall of the first type semiconductor layer 122e, a side wall of the active layer 124e, and a side wall of the second type semiconductor layer 126e of the first micro LED 120e are cut flush with a surface. The active layer 134e of the second micro LED 130e exposes a portion of the first type semiconductor layer 132e, and a side wall of the second type semiconductor layer 136e of the second micro LED 130e is cut flush with a side wall of the active layer 134e. That is, in the embodiment shown in FIG. 5A and FIG. 5B, the areas of the active layers 124e and 134e are not changed by the sizes of the through holes. Instead, the overall area of the active layers 124e and 134e and the second type semiconductor layers 126e and 136e is reduced from the edges. Thus, the problem of edge leakage is improved and the light-emitting efficiency of the micro LEDs 120e and 130e is enhanced. The structural design of the first micro LED 120e and the second micro LED 130e allows the length of the active layer 124e of the first micro LED 120e to be greater than the length of the active layer 134e of the second micro LED 130e, that is, allows the area of the active layer 124e of the first micro LED 120e to be greater than the area of the active layer 134e of the second micro LED 130e. As a result, the effective light-emitting area of the first micro LED 120e is greater than the effective light-emitting area of the second micro LED 130e, so as to balance the influence of human eyes on color perception and improve the display quality.

Figure 6:
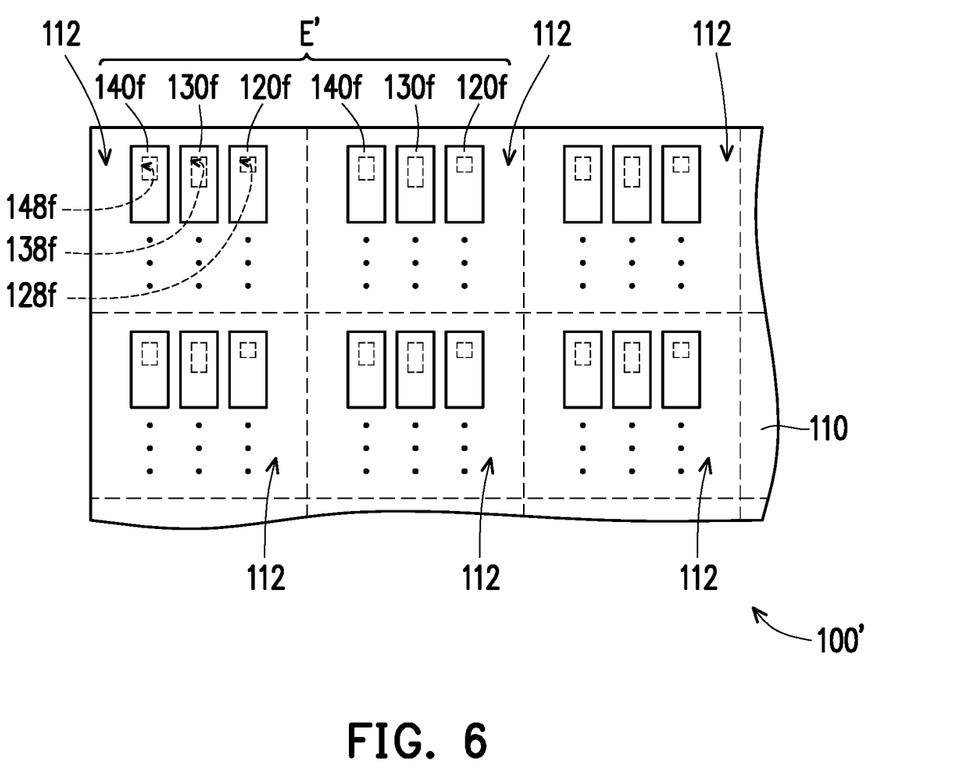
FIG. 6 is a schematic top view of a display apparatus according to another embodiment of the disclosure.

FIG. 6 is a schematic top view of a display apparatus according to another embodiment of the disclosure. Referring to FIG. 1A and FIG. 6, the display apparatus 100' of this embodiment is similar to the display apparatus 100 in FIG. 1A, and a difference between them is that: in this embodiment, the effective light-emitting area of the first micro LED 120f, which emits red light, is greater than the effective light-emitting area of the third micro LED 140f, which emits green light, and the effective light-emitting area of the third micro LED 140f, which emits green light, is greater than the effective light-emitting area of the second micro LED 130f, which emits blue light. Here, the through hole 128f of the first micro LED 120f is smaller than the through hole 148f of the third micro LED 140f and the through hole 148f of the third micro LED 140f is smaller than the through hole 138f of the second micro LED 130f, such that the micro LEDs E' have similar sizes but different effective light-emitting areas. In an embodiment, a ratio of the areas of the active layers of the first micro LED 120f and the second micro LED 130f is 1.5 to 5, and a ratio of the areas of the active layers of the first micro LED 120f and the third micro LED 140f is 1 to 3.

To sum up, in the display apparatus of the disclosure, the micro LEDs in each of the pixel regions have equal orthogonal projection areas on the driving substrate, and at least two micro LEDs in each of the pixel regions have different effective light-emitting areas. In other words, the micro LEDs in each of the pixel regions have the same size and at least two micro LEDs have different effective light-emitting areas. This design balances the effect of color perception on human eyes and improves the display quality, and allows the display apparatus of the disclosure to achieve efficient electrical reliability and reduced the production costs.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A display apparatus, comprising:
a driving substrate, having a plurality of pixel regions; and
a plurality of micro LEDs disposed in the each of the plurality pixel regions of the driving substrate and electrically connected to the driving substrate and each of the micro LEDs includes a first type semiconductor layer, an active layer and a second type semiconductor layer,
wherein each of the pixel regions includes at least two micro LEDs, and the at least two micro LEDs have the same size and different effective light-emitting areas of the active layers and emit different colored lights.

2. The display apparatus according to claim 1, wherein at least two of the micro LEDs in each of the pixel regions comprise a first micro LED that emits red light and a second micro LED that emits blue light, and an effective light-emitting area of the first micro LED is greater than an effective light-emitting area of the second micro LED.

3. The display apparatus according to claim 2, wherein in each of the pixel regions, an orthogonal projection length of the first micro LED on the driving substrate is equal to an orthogonal projection length of the second micro LED on the driving substrate.

4. The display apparatus according to claim 2, further comprising a through hole, wherein the through hole sequentially penetrates the second type semiconductor layer, the active layer, and a portion of the first type semiconductor layer, and a hole diameter of the through hole of the first micro LED is smaller than a hole diameter of the through hole of the second micro LED in each of the pixel regions.

5. The display apparatus according to claim 4, wherein an area of the active layer of the first micro LED is greater than an area of the active layer of the second micro LED.

6. The display apparatus according to claim 2, wherein the active layer has a low resistance region and a high resistance region surrounding the low resistance region, and in each of the pixel regions, an area of the high resistance region of the active layer of the first micro LED is smaller than an area of the high resistance region of the active layer of the second micro LED.

7. The display apparatus according to claim 2, wherein in each of the pixel regions, a side wall of the first type semiconductor layer, a side wall of the active layer, and a side wall of the second type semiconductor layer of the first micro LED are cut flush with a surface, and a length of the active layer of the second micro LED is larger than a length of the active layer of the first micro LED.

8. The display apparatus according to claim 2, further comprising a current distributing layer, wherein in each of the pixel regions, a side wall of the first type semiconductor layer, a side wall of the active layer, and a side wall of the second type semiconductor layer are cut flush with a surface, and a contact area between the current distributing layer and the second type semiconductor layer of the second micro LED is smaller than a contact area between the current distributing layer and the second type semiconductor layer of the first micro LED.

9. The display apparatus according to claim 2, wherein in each of the pixel regions, a side wall of the first type semiconductor layer, a side wall of the active layer, and a side wall of the second type semiconductor layer of the first micro LED are cut flush with a surface, and the active layer of the second micro LED exposes a portion of the first type semiconductor layer.

10. The display apparatus according to claim 2, wherein a ratio of the effective light-emitting area of the first micro LED to the effective light-emitting area of the second micro LED is 1.5 to 5.

11. The display apparatus according to claim 1, wherein each of the pixel regions comprises a first micro LED that emits red light, a second micro LED that emits blue light, and a third micro LED that emits green light, wherein an effective light-emitting area of the first micro LED is greater than an effective light-emitting area of the second micro LED and the effective light-emitting area of the second micro LED is greater than an effective light-emitting area of the third micro LED.

12. The display apparatus according to claim 1, wherein each of the pixel regions comprises a first micro LED that emits red light, a second micro LED that emits blue light, and a third micro LED that emits green light, wherein an effective light-emitting area of the first micro LED is greater than an effective light-emitting area of the second micro LED or the third micro LED.

* * * * *

UNITED STATES PATENT AND TRADEMARK OFFICE
CERTIFICATE OF CORRECTION

PATENT NO. : 10,930,202 B2  
APPLICATION NO. : 16/430454  
DATED : February 23, 2021  
INVENTOR(S) : Tzu-Yang Lin et al.

Page 1 of 1

It is certified that error appears in the above-identified patent and that said Letters Patent is hereby corrected as shown below:

On the Title Page

Item (72) Inventors should read as:  
Tzu-Yang Lin, MiaoLi County(TW);  
Yu-Hung Lai, MiaoLi County(TW);  
Pei-Hsin Chen, MiaoLi County(TW);  
Yi-Chun Shih, MiaoLi County(TW);  
Yi-Ching Chen, MiaoLi County(TW);  
Yu-Chu Li, MiaoLi County(TW);  
Ying-Tsang Liu, MiaoLi County(TW).

Signed and Sealed this  
Eleventh Day of May, 2021

Drew Hirshfeld  
*Performing the Functions and Duties of the*  
*Under Secretary of Commerce for Intellectual Property and*  
*Director of the United States Patent and Trademark Office*